(12) United States Patent
Dubois et al.

(10) Patent No.: US 9,514,929 B2
(45) Date of Patent: Dec. 6, 2016

(54) DIELECTRIC FILLING MATERIALS WITH IONIC COMPOUNDS

(71) Applicant: International Business Machines Corporation, Armonk, NY (US)

(72) Inventors: Geraud J. Dubois, Los Altos, CA (US); Krystelle Lionti, Campbell, CA (US); Willi Volksen, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/677,704

(22) Filed: Apr. 2, 2015

(65) Prior Publication Data

US 2016/0293407 A1  Oct. 6, 2016

(51) Int. Cl.
*H01L 21/302* (2006.01)
*H01L 21/3105* (2006.01)
*H01L 21/02* (2006.01)
*H01L 21/768* (2006.01)

(52) U.S. Cl.
CPC ..... *H01L 21/02118* (2013.01); *H01L 21/0206* (2013.01); *H01L 21/02175* (2013.01); *H01L 21/02318* (2013.01); *H01L 21/31058* (2013.01); *H01L 21/76837* (2013.01)

(58) Field of Classification Search
None
See application file for complete search history.

(56) References Cited

U.S. PATENT DOCUMENTS

| | | | |
|---|---|---|---|
| 6,703,324 B2 * | 3/2004 | Wong | H01L 21/02118 257/E21.273 |
| 7,166,265 B2 | 1/2007 | Pinnavaia et al. | |
| 7,582,904 B2 | 9/2009 | Fujii et al. | |
| 8,623,951 B2 | 1/2014 | Kambe | |
| 9,153,356 B2 * | 10/2015 | Chen | C25D 5/02 |
| 2006/0234505 A1 | 10/2006 | Asano et al. | |
| 2011/0050040 A1 * | 3/2011 | Yamamoto | F03G 7/005 310/338 |
| 2013/0017682 A1 * | 1/2013 | Bruce | H01L 21/7682 438/694 |
| 2013/0017688 A1 * | 1/2013 | Dubois | H01L 21/3105 438/759 |
| 2013/0101889 A1 | 4/2013 | Mizuno et al. | |

(Continued)

OTHER PUBLICATIONS

Lionti et al., "Toward Successful Integration of Porous Low-k Materials: Strategies Addressing Plasma Damage," ECS Journal of Solid State Science and Technology, Oct. 28, 2014, pp. 3071-3083.

(Continued)

*Primary Examiner* — Shamim Ahmed
(74) *Attorney, Agent, or Firm* — Shumaker & Sieffert, P.A.

(57) ABSTRACT

A method includes applying a filling material to a surface of a first layer overlying a substrate. The first layer includes a dielectric material with a plurality of pores. The filling material includes a polymer and an ionic compound. The method includes heating the structure to enable the filling material to at least partially fill the plurality of pores throughout the first layer, and removing the residual filling material from the surface of the first layer, while leaving substantially all of the polymer in the pores of the first layer.

17 Claims, 4 Drawing Sheets

(56) References Cited

U.S. PATENT DOCUMENTS

2015/0262865 A1\* 9/2015 Liu .................. H01L 21/76825
438/676

OTHER PUBLICATIONS

Frot et al., "Post Porosity Plasma Protection: Scaling of Efficiency with Porosity," Advanced Functional Materials, Apr. 17, 2012, 8 pp.
Volksen et al., "Hybrid low dielectric constant thin films for microelectronics," Science Direct, May 28, 2013, pp. 20-24.

\* cited by examiner

| Trend | Porosity | Dielectric Constant | Mechanical Properties | Integratability |
|---|---|---|---|---|
| Impact | - | Positive | Negative | Negative |

FIG. 1

Remove Residual Filling Material

DIELECTRIC FILLING MATERIALS WITH IONIC COMPOUNDS

BACKGROUND

The semiconductor industry continues to develop new, low dielectric constant (k) materials to improve microprocessor performance. Introducing porosity to dielectric materials can be used to decrease the k of the materials.

FIG. 1 is a conceptual diagram illustrating the effect of increasing porosity on properties of dielectric materials. While increasing porosity may lower the dielectric constant, other properties of dielectric materials such as, for example, stiffness, fracture resistance, and interfacial adhesion, can be negatively impacted.

Modern semiconductor manufacturing processes can also damage the porous dielectric materials at different stages of the integration process during, for example, hardmask deposition, reactive ion etch, photoresist strip, liner deposition, chemical mechanical polishing, or cap deposition. The highly accessible surface area of the porous dielectric materials may increase sensitivity to plasma processing steps.

SUMMARY

In general, the present disclosure describes techniques for filling the pores of a porous dielectric material with a filling material including an ionic compound.

In an embodiment, a method includes applying a filling material to a surface of a first layer overlying a substrate. The first layer includes a dielectric material with a plurality of pores. The filling material includes a polymer and an ionic compound. The method includes heating the structure to enable the filling material to at least partially fill the plurality of pores throughout the first layer, and removing the residual filling material from the surface of the first layer, while leaving substantially all of the polymer in the pores of the first layer.

In an embodiment, a method includes applying a filling material to a surface of a first layer overlying a substrate. The first layer includes a dielectric material having a plurality of pores. The filling material comprises a polymer and an ionic compound. The method includes heating the structure to a first temperature to enable the filling material to at least partially fill the plurality of pores throughout the first layer. Heating the structure results in a residual amount of filling material being left on the surface of the first layer. The method includes removing substantially all of the residual amount of filling material from the surface of the first layer, while leaving substantially all of the filling material throughout the first layer, and performing at least one process on the structure, and after performing the at least one process, removing the filling material from the plurality of pores by heating the structure to a second temperature to decompose the filling material.

In various embodiments, the ionic compound can enhance compatibility of the filler material with the pores of the porous dielectric material, which can ensure that the filler material remains in the pores during subsequent integration processing steps. In various embodiments, the presence of the filler material in the pores can increase the mechanical strength of the dielectric layer during subsequent integration processing steps.

The details of one or more aspects of the invention are set forth in the accompanying drawings and the description below. Other features, objects, and advantages of the invention will be apparent from the description and drawings, and from the claims.

BRIEF DESCRIPTION OF DRAWINGS

The foregoing and other aspects of this invention are made more evident in the following Detailed Description, when read in conjunction with the attached Drawing Figures, wherein:

FIG. 1 is a conceptual diagram illustrating the effect of increasing porosity on properties of dielectric materials.

It should be understood that features of certain Figures of this disclosure may not necessarily be drawn to scale, and that the Figures present non-exclusive examples of the techniques disclosed herein.

DETAILED DESCRIPTION

If a dielectric material layer or film includes a large number of pores and a high degree of pore connectivity, metals used in adjacent liner layers (e.g., Ta, TaN) or seed layers (e.g., Cu, Ru) can penetrate the pores and degrade the dielectric. To reduce such degradation, a filling material may be spin-coated on a surface of the porous dielectric material and baked to cause the filling material to penetrate the pores of the dielectric material layer. The filled dielectric material can protect the dielectric layer during subsequent processing steps, and the filling material can later be burned away, which can restore the dielectric constant of the material to its initial value.

Figure 2:
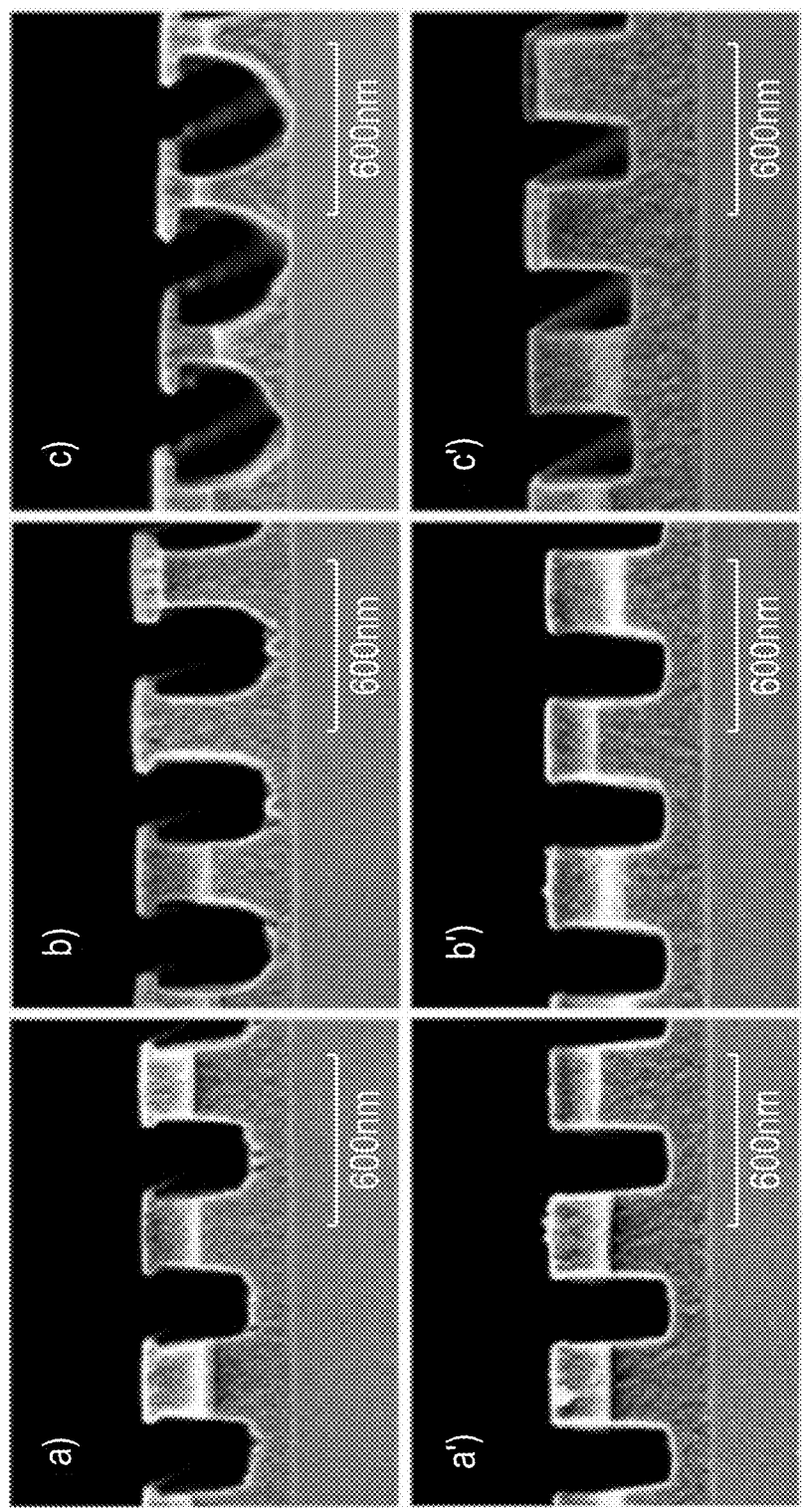
FIG. 2 includes photographs of electron microscope cross-sections of trenches of unfilled (FIGS. 2a-2c) and filled (FIGS. 2a'-2c') porous dielectric materials that have undergone integration processing steps used in semiconductor manufacturing.

FIGS. 2a-2c are transmission electron microscope (TEM) images showing trenches in unfilled porous dielectric materials that were exposed to chemical agents typically utilized in semiconductor processing procedures, including an O2 strip followed by a soak in dilute HF. FIGS. 2a'-2c' show trenches in filled dielectric materials that were exposed to the same chemical agents. Comparing FIGS. 2a-2c to FIGS. 2a'-2c' reveals significant loss of critical dimensions for the unprotected material (pitting, micro-trenching of the bottom line, undercuts just below the hardmask) whereas the final trench profiles of the filled dielectric materials are very much alike, which indicates that filling the dielectric material can protect the dielectric materials during aggressive processing steps.

A limited selection of potential filler candidates can be used in pore filling processes. In various embodiments, the molecular weight of the filler should be compatible with the dielectric pore size to make sure the filler penetrates into the pores. In various embodiments, the filler should also have a relatively low viscosity during the post-apply bake to allow pore filling by capillary action. In various embodiments, the filler should also be able to survive thermal excursions up to about 300° C. to remain stable during processing steps, but must be decomposable and removable at temperatures less than about 400° C. In addition, if the filler material has low interaction with the dielectric pore walls, filler wash out can occur if solvent based overburden removal is used, and, as a result, lower or no protective filling is obtained.

Figure 3A:
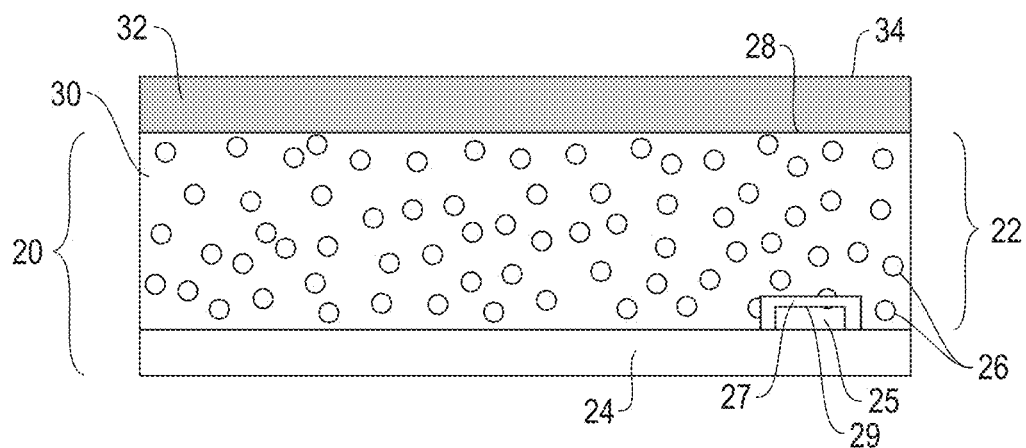
FIG. 3A is a lateral cross-sectional view of a structure including a porous dielectric material utilized in the exemplary process of FIG. 4.

Referring to FIG. 3A, an initial amount 34 of a filling material 32 may be applied, for instance, by spin-coating, on a surface 28 of a structure 20. In various embodiments, the structure 20 can include, for example, a semiconductor wafer or interconnect structure that can be used in a microelectronic device. In various non-limiting embodiments, the microelectronic device including the structure 20 includes high speed microprocessors, application specific integrated circuits (ASICs), memory devices, and the like.

The structure 20 includes a first layer 22 of a dielectric material 30 with a plurality of pores 26. In some non-limiting embodiments, the first layer 22 may be formed of single or dual damascene wiring with a high electrical conductivity material (e.g., copper, aluminum, alloys thereof) embedded in an ILD and optionally capped with a diffusion barrier dielectric (e.g., SiN, NBLOK).

In various embodiments, the dielectric material 30 is an ultra-low k (ULK) material or a low k material having a k value ranging from about 1.8 to about 2.5, or from about 2.0 to about 2.4.

Suitable examples of dielectric material include, but are not limited to, silicates, organosilicates, polyimides, polybenzoxazoles, polyarylenes, and polyarylene ethers. In various embodiments, the plurality of pores 26 includes micropores, for instance having average pore diameters less than about 2 nm, or mesopores, for instance, having average pore diameters from about 2 nm to about 50 nm, or macropores, for instance having average pore diameters greater than 50 nm, or any combinations thereof.

Figure 3B:
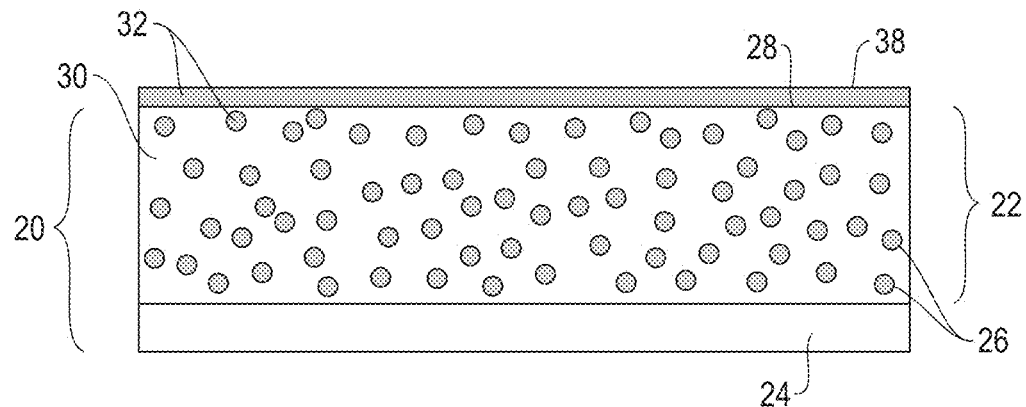
FIG. 3B is a lateral cross-sectional view of the structure of FIG. 3A as heated during the process of FIG. 4.
Figure 3C:
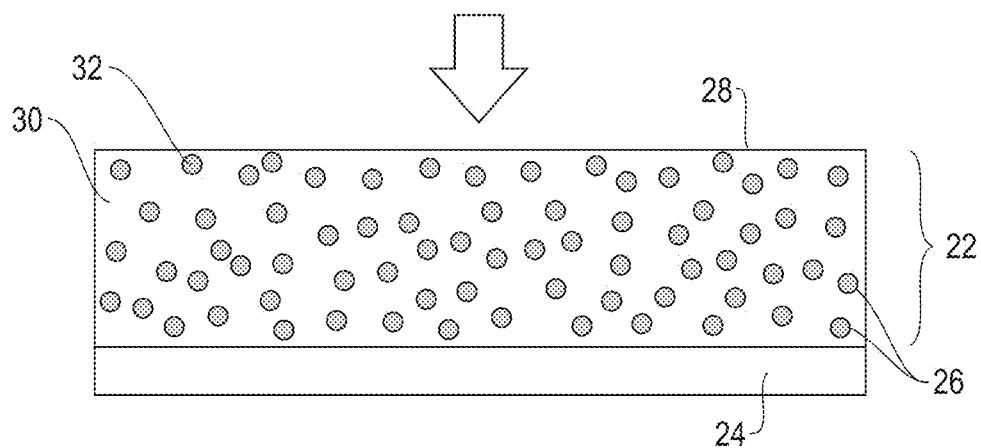
FIG. 3C is a lateral cross-sectional view of the exemplary structure of FIG. 3B after removal of residual filling material according to an embodiment of the process of FIG. 4.

In various embodiments now shown in FIGS. 3A-3C, the plurality of pores 26 may include pores having different sizes and size distributions. In an embodiment, the plurality of pores 26 includes pores having average pore diameters less than 10 nm, and preferably less than 20 nm.

In some embodiments not shown in FIG. 3A-3C, the pores 26 are interconnected, which in this disclosure means that the pores are joined by channels or passages, which may be regular or irregular in size and shape. In various embodiments, at least some of the pores 26 are directly connected to the surface 28, and at least some of the pores 26 are indirectly connected to the surface 28 via channels or passages connecting the pores 26.

The first layer 22 overlies a substrate 24. In various non-limiting embodiments, the substrate 24 includes a silicon wafer that contains microelectronic devices, a ceramic chip carrier, an organic chip carrier, a glass substrate, a GaAs, SiC or other semiconductor wafer, a circuit board, a plastic substrate, and combinations thereof.

In some embodiments, the structure 20 may include at least one conductive feature 25 formed on substrate 24. The substrate 24 can further include at least one insulating layer 27 surrounding the at least one conductive feature 25. For example, the at least one insulating layer 27 may surround the at least one conductive feature 25 at its bottom and lateral surfaces.

In some embodiments, the structure 20 may include at least one conductive barrier 29 layer disposed at an interface between the at least one insulating layer 27 and the at least one conductive feature 25. In some examples, the combination of the at least one conductive feature 25 and the at least one insulating layer 27 may be repeated to form a multilevel interconnect stack.

Figure 4:
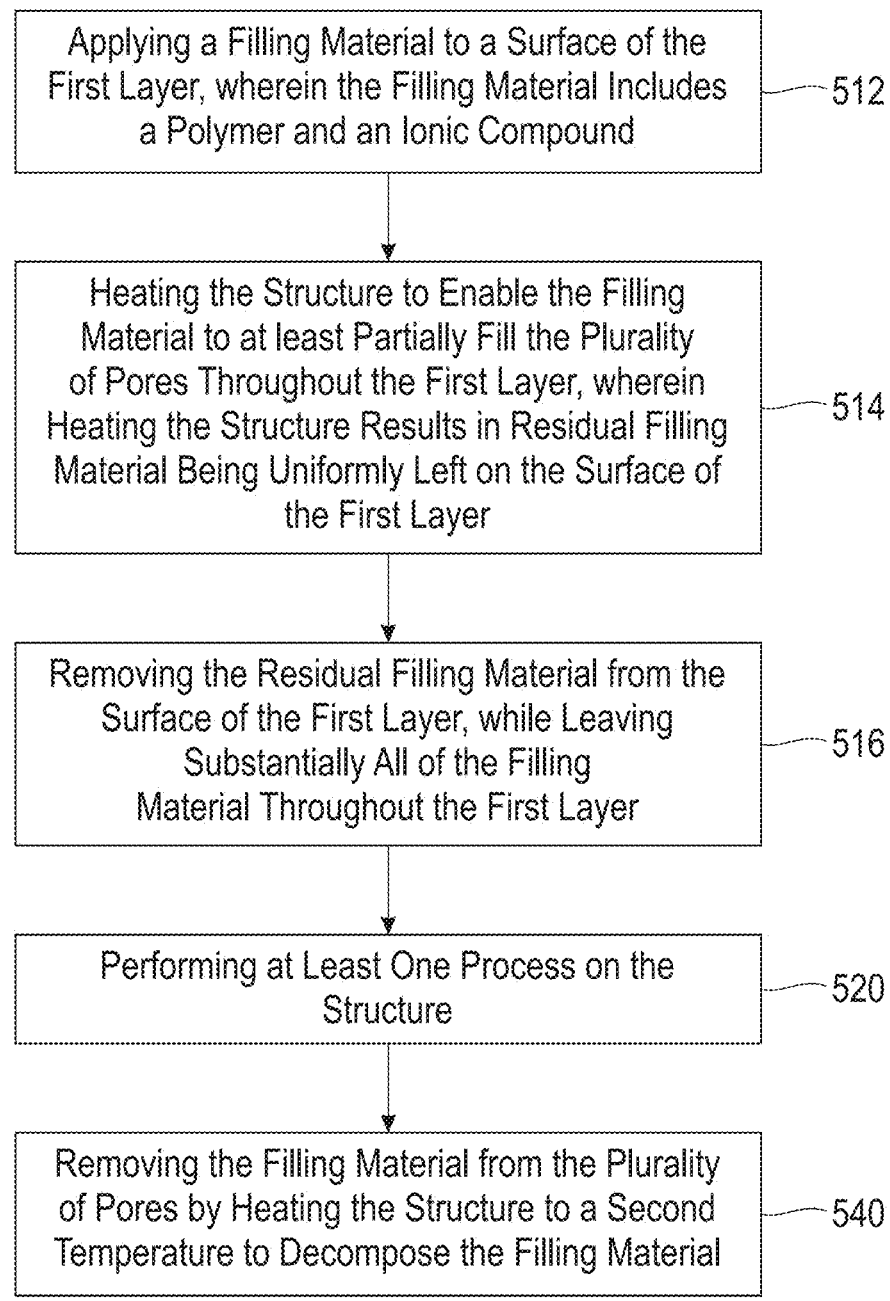
FIG. 4 is a flow diagram illustrating an embodiment of a process for filling a porous dielectric material according to the present disclosure.

Referring to step 512 in FIG. 4, a process for filling the pores 26 in the dielectric material 30 of FIG. 3A includes applying a filling material 32 to surface 28 of first layer 22, for instance, by spin-coating. In some non-limiting embodiments, the step of applying the filling material 32 takes place after a plurality of pores 26 have been formed in first layer 22, and preferably after the dielectric material of first layer 22 has reached its maximum shrinkage under curing deposition conditions.

The filling material 32 includes a polymer and about 0.01 to about 100,000 ppm, or about 0.01 to about 1,000 ppm of an ionic compound. As shown in more detail below, in various embodiments the ionic compound can mitigate, prevent or inhibit wash-out of the filling material 32 from the pores 26 of the dielectric material 22 as the structure 20 is processed.

The polymer in the filling material 32 is advantageously a thermally labile organic material having a molecular weight compatible with the pore size of the dielectric material of first layer 22, which can facilitate penetration of the filling material into the pores of the dielectric material. In various embodiments, the molecular weight of the polymer in the filling material 32 has a weight-averaged molecular weight ($M_w$) from about 100 Da to about 500,000 Da, and preferably from about 100 Da to about 10,000 Da.

The polymer in the filling material 32 should preferably be able to survive thermal excursions up to about 350° C. to ensure its stability during potential subsequent integration processes, while still being decomposable and removable from the dielectric material between about 350° C. and about 450° C.

In addition, as noted above, in various embodiments, favorable compatibility between the filling material 32 and the surface chemistry of the dielectric material of the first layer 22 can enhance the successfulness of the filling process which may be assessed using x-ray reflectivity (XRR), spectral reflectometry (SRM), depth profiling by X-ray photoelectron spectroscopy (d-XPS), depth profiling by secondary ion mass spectrometry (d-SIMS), ellipsometric porosimetry (EP) and Fourier transform infrared spectroscopy (FTIR), as described in Frot, et al., "Post porosity plasma protection: scaling of efficiency with porosity," Advanced Functional Materials 22,14 (2012): 3043-3050.

In various embodiments, compatibility between the filling material 32 and the dielectric material is related to the success of filling the plurality of pores 26 with the filling material 32, and may be evaluated by measuring the degree of fill (determined as a percentage of total porosity) and fill uniformity throughout the film.

Suitable polymers for the filling material 32 include, but are not limited to, methacrylate-based copolymers or other polymers described in Frot, et al., "Application of the protection/deprotection strategy to the science of porous materials," Advanced Materials 23 (25) (2011): 2828-2832. In various embodiments, the polymers may include linear, cyclic, addition or condensation-type polymers.

The ionic compound in the filler material may be an inorganic compound, an organic compound, or any species capable of contributing ions. In various embodiments, the ionic compounds are immobile in the dielectric. Without being bound by theory, presently available evidence indicates that non-mobile or immobile ions would have little or no impact on the final electric properties of structure 20.

Mobility of ions may depend on factors including ion mass, charge, size and shape. In various embodiments, mobility of ions is measured by TVS (triangular voltage sweep) or C-V shift (based on a bias stress of a MIS (metal-insulator-semiconductor) structure). In various non-limiting embodiments, the ionic compound in the filling material can include one or more alkali metals (metals in Group IA of the Periodic Table, including, Li, Na, K, Rb, Cs and Fr). In some embodiments, the ionic compound in the filling material includes Cs, Rb, and combinations thereof.

In another embodiment, the ionic compound can include an organic salt. Non-limiting examples of suitable organic salts include 1-Butyl-3-methylimidazolium acetate, 1-Ethyl-3-methylimidazolium acetate, and combinations thereof. In an embodiment, the ionic compound may include salts of amino-compounds.

In some embodiments, the filling material 32 may optionally include about 10 wt % to about 99 wt %, based on the total weight of the filling material, of an additive such as, for example, solvents, surfactants and the like.

Suitable solvents include, but are not limited to, PGMEA, alcohols, xylenes, DMF, and NMP (polar aprotic and protic solvents).

Suitable surfactants include, but are not limited to, amphiphilic molecules.

A sufficient initial amount 34 of filling material 32 is applied, as shown in FIG. 3A, so that after heating a residual amount 38 of residual filling material 32 remains disposed over surface 28 of first layer 22 (FIG. 3B). In step 514 of the process of FIG. 4 the structure 20, the filling material 32, or both, are heated to a first temperature for a time sufficient to enable the filling material 32 to at least partially fill all or substantially all of plurality of pores 26 disposed throughout first layer 22 (FIG. 3B). In various embodiments, which are not intended to be limiting, the structure 20 and/or filling material 32 can be heated to a temperature above the glass-transition temperature $T_g$ of the polymer in the filling material 32. In an embodiment, the structure 20 and/or filling material 32 can be heated to a temperature of about 100° C. to about 300° C. for about 1 minute to about one hour. In another embodiment, the structure 20 and/or filling material 32 can be heated to a temperature of about 125° C. to about 175° C. for about 2 to about 5 minutes.

In various embodiments, when heated, the filling material 32 can fill a larger number of the pores 26, and can fill a larger percentage of the volume of each pore 26. In various embodiments, the heating step 514 can reduce or eliminate de-wetting and inhomogeneous filling of the pores 26, particularly at or near the surface 28 of the first layer 22, which can more uniformly fill the pores 26. In some embodiments, a substantial number of the pores 26 are substantially filled with the filling material 32, particularly near the surface 28 of the first layer 22. In some embodiments, a portion of the first layer 22 underlying the surface 28 and having pores 26 at least partially filled with the filling material may have a density between about 1.0 g/cm³ and about 1.50 g/cm³.

Referring to step 516 in FIG. 4 and FIG. 3C, the filling material remaining on surface 28 of the filled first layer 22 (e.g., an ILD film) is removed by a suitable method, such as, for example, solvent rinse, plasma etch, reaction ion etching (RIE) strip, wet dissolution or gentle polishing.

Following the removal step, a substantial amount of the polymer or filling material remains in the filled pores 26 of the structure 20. In an embodiment, more than about 90% of the initial amount of filling material 32 remains in the filled pores following the removal step.

As shown schematically in FIG. 3C, substantially all of the filling material 32 in layer 22 remains in the pores 26 even after the structure is subjected to one of the suitable methods described above for removing the residual amount 38 of residual filling material 32 that is left on surface 28. As a result, homogeneous and high filling levels of the volumetric porosity of the porous dielectric material 22 may be achieved, such that the filling material is not washed out of the filled pores during or as a result of removing the residual filling material.

Referring again to FIG. 4, after removal of the filling material from the surface 28 of the first layer 22, in some embodiments a process step 520 may optionally be performed on the structure 20. Suitable processes include, but are not limited to, integration or microfabrication processes performed in the production and/or assembly of semiconductors and/or microprocessors, performing a dilute hydrofluoric acid (DHF) soak on the structure, and combinations thereof.

In one embodiment, a hardmask layer may be deposited on top of the filled first layer 22, for example, using plasma enhanced chemical vapor deposition (PECVD) or spin-on techniques. The hardmask can be formed of a suitable material including, as non-limiting examples, $SiO_2$, $Al_2O_3$, SiN, $Si_3N_4$, SiC, SiCOH, and combinations thereof. The hardmask layer may further be formed by more than one layer of material, though in various embodiments the total thickness should be less than 250 nm or less than 100 nm. A photoresist layer may optionally be applied to the top of the hardmask layer, exposed to generate a desired pattern, developed, and then baked, for example, at a temperature of about 200° C. or less.

In some embodiments, at least a part of the exposed portion of the hardmask layer and the filled first layer 22 (e.g., an ILD layer of ULK material) may be etched (e.g., in a plasma etching process) to remove those regions defined by openings in the photoresist pattern on top of the hardmask layer, creating one or more etched openings in the hardmask layer and first layer 22. Any remnants of the photoresist layer may then be removed by, for example, a strip process.

During such a strip process, the porosity of dielectric material 30, if not filled with a filling material, can be exposed to and damaged by the strip process chemistry used to remove the photo-resist layer. Without first filling the pores with a filling material, such an exposure may cause the dielectric constant and leakage current of first layer 22 (for example, an ILD of ULK material) to significantly increase. In contrast, when first layer 22 is in a non-porous, hybrid state enriched in carbon, due to the presence of filling material 32 in the plurality of pores 26 as described herein, little or no damage may occur to filled first layer 22 during the strip process.

In some embodiments, a liner material may then be deposited to form a liner layer on top of the hardmask layer.

The liner layer may be made of a material such as TaN, TiN, Ti, Ta, or various combinations thereof, as non-limiting examples, for achieving adhesion and diffusion barrier properties. In some embodiments, a seed layer (e.g., copper) optionally may be deposited on top of the liner layer. The seed layer may be deposited by sputtering, for example, and may be used to facilitate subsequent electroplating.

The etched opening can then be filled with a metal, such as, for example, copper. The metal may be formed by electroplating, for example, and may overfill the opening. After the etched opening is filled with the metal, the structure 20 may optionally be planarized, for example, by a chemical mechanical polishing (CMP) process, to achieve one or more planar surfaces with a metal inlaid structure. In this CMP step, polishing is performed until all of the excess metal, liner and hardmask on top of the filled first layer 22 is removed, thus exposing at least part of surface 28 of filled first layer 22.

In some embodiments, the process 540 of FIG. 4 further optionally includes removing the filling material 32 from the plurality of pores 26 of the first layer 22 by heating at least one of the structure 20 or the filling material 32 to a second temperature for time sufficient to decompose the filling material 32. In various embodiments, the first layer can be heated in an oven, or with ultraviolet (UV) irradiation, or with a combination thereof. In other embodiments, the filling material 32 can be removed by microwaves, lasers, or other suitable sources of decomposition energy.

In some embodiments, the second temperature is higher than the first temperature. In some embodiments, which are not intended to be limiting, at least one of the structure 20 or the filling material 32 is heated to about 300° C. to about 450° C. for a time up to about 1 hour. In some embodiments, after removal of the filling material from the pores 26, the layer 22 may have, for example, a density between about 0.80 g/cm$^3$ and about 1.20 g/cm$^3$.

After the removal of the filling material 32, the dielectric constant of the dielectric material 30 returns to at or near its initial value before filling of the pores 26 with the filling material 32, for instance, within 0 to 3% of the initial k value.

A cap layer of an insulating material (e.g., silicon carbide, silicon nitride, silicon carbonitride, or combinations thereof) may optionally be deposited on top of first layer 22 to prevent diffusion of the metal and to protect structure 20, or any electronic device incorporated therein, from mechanical abrasion or other damage.

The present disclosure will be illustrated by the following non-limiting examples.

EXAMPLES

Example 1

Examples of low interactions between filling materials and dielectric materials are presented in Table 1. Filling material wash-out occurs during the final solvent rinse (overburden removal) and as a result lower or no filling is obtained. This issue is commonly encountered as ULK materials porosity keeps increasing and is illustrated in Table 1.

TABLE 1

| ULK | Microelectronic grade fillers | Initial | | After spin-apply and heating | | After solvent rinse and post-rinse heating | |
|---|---|---|---|---|---|---|---|
| | | t (nm) | n | t (nm) | n | t (nm) | n |
| spin-on k = 2.4 | Filler 1 | 168.9 | 1.3619 | 168.9 | 1.4675 | 169.0 | 1.3631 |
| | Filler 2 | 488.9 | 1.3704 | 490.2 | 1.4680 | 487.7 | 1.4419 |
| | Filler 3 | 488.4 | 1.3686 | — | — | 488.5 | 1.4337 |
| spin-on k = 2.0 | Filler 1 | 207.0 | 1.2659 | 206.5 | 1.4531 | 207.1 | 1.2688 |
| | Filler 2 | 206.4 | 1.2711 | — | — | 206.8 | 1.2861 |
| | Filler 3 | 205.8 | 1.2709 | 205.2 | 1.4353 | 206.3 | 1.2888 |

Table 1 shows, inter alia, ULK materials with varying porosities (k=2.0 and k=2.4) that were filled with different microelectronic grade filler solutions using the process described above. Microelectronic grade fillers 1, 2 and 3 include PEO-PPO copolymers or homopolymers, polyacrylates, polymethacrylate copolymers and homopolymers, and display different chemical structures and were selected for their favorable pore-filling properties discussed above, such as a molecular weight compatible with the pore size of the dielectric material, a low melt viscosity during post-application heating, ability to survive thermal excursions up to about 300° C., and decomposability between about 300° C. and about 400° C.

The increase in the bulk refractive index n (from 1.36-37 to 1.46-47 for the k=2.4 ULK, and from 1.26-27 to 1.43-45 for the k=2.0 ULK) observed after filler spin-apply and heating indicate substantial initial pore filling (over 90% of the total porosity). Following a solvent rinse and post-rinse heating, however, the refractive index drops. In the case of the k=2.4 ULK with filler 2 & 3, only a slight decrease was observed, indicating partial filler wash out only. Regarding the same ULK with filler 1, and the k=2.0 ULK (irrespective of the filler), a sharp drop was observed as the refractive index returned to its initial value, evidencing complete filler wash out. This drop is increasingly pronounced as i) the ULK porosity increases and ii) the filler molecular weight ($M_w$) decreases. In this case, all fillers had a similar Mw (1.2 kDa to 3 kDa), and the impact observed is primarily a result of the ULK pore size.

As discussed above, such filler wash-out, leading to low filling levels, is unacceptable and constitutes a serious limitation on further integration processes. The low filling level and the nonhomogeneous filling across the example wafers of Table 1 demonstrate limitations in working with filling materials not modified according to certain aspects of this disclosure.

Example 2

Examples of the beneficial effect of ionic compound in the filler material, by inhibiting filling material wash-out, are shown in Table 2. In these examples, the same filler solution, before and after purification, was used to fill different ULK materials. The filler solution purification is a process carried out to eliminate contaminants and obtain a "microelectronic grade" solution (ions concentration <few ppb). Conversely, the ion concentration is much higher for unpurified solutions.

TABLE 2

| ULK | Microelectronic grade fillers | Initial | | After spin-apply and heating | | After solvent rinse and post-rinse heating | |
|---|---|---|---|---|---|---|---|
| | | t (nm) | n | t (nm) | n | t (nm) | n |
| spin-on k = 2.4 | Unpurified Filler 1 | 152.2 | 1.3695 | 153.5 | 1.4559 | 153.5 | 1.4557 |
| | Microelectronic grade Filler 1 | 168.9 | 1.3619 | 168.9 | 1.4675 | 169.0 | 1.3631 |
| spin-on k = 2.0 | Unpurified Filler 1 | 206.6 | 1.2699 | 206.2 | 1.4531 | 207.1 | 1.3755 |
| | Microelectronic grade Filler 1 | 207.0 | 1.2659 | 206.5 | 1.4571 | 207.1 | 1.2888 |

Table 2 shows, inter alia, optical data of different ULKs filled with unpurified and microelectronic grade fillers. For all samples, a very high fill level (>90%) was obtained following spin-apply and heating, as shown by the refractive indices. However, different behaviors were observed after solvent rinse and post-rinse heating, based on the degree of purity of the solution. While the filler was fully washed out of the pores when the microelectronic (pure) grade filler solution was used, partial or no filler wash-out was obtained with unpurified fillers. These results strongly highlight the role played by the ions in unpurified fillers to retain the filler within the ULK pores.

In order to confirm and better assess the effect of ionic compounds on filling material, ionic compounds were added to microelectronic grade (pure) filler solutions, in different concentrations. Systems based on two different ULK matrices, three different fillers and three different ionic compounds were tested. Regarding the latter, only thermally degradable (by 400° C.) or non-mobile ionic compounds were used in this study, in order to ensure that the final electrical properties of the device would not be affected. It is worth mentioning that these ionic compounds requirements are specific to microelectronics applications and might not be required for other applications.

Example 3

Two ionic liquids (1-Butyl-3-methylimidazolium acetate (Bu-IL) and 1-Ethyl-3-methylimidazolium acetate (Et-IL)) were selected as thermally degradable ionic compounds. The results obtained with these ionic liquids combined with filler 1 in the k=2.0 ULK material are presented in Table 3.

TABLE 3

| ULK | Microelectronic grade fillers | Initial | | After spin-apply and heating | | After solvent rinse and post-rinse heating | |
|---|---|---|---|---|---|---|---|
| | | t (nm) | n | t (nm) | n | t (nm) | n |
| spin-on k = 2.0 | Microelectronic grade Filler 1 | 207.0 | 1.2659 | 206.5 | 1.4571 | 207.1 | 1.2688 |
| | Microelectronic grade filler 1 + 0.1 wt % Et-IL | 205.9 | 1.2537 | 205.7 | 1.4531 | 205.6 | 1.3943 |
| | Microelectronic grade filler 1 + 0.1 wt % BuIL | 207.4 | 1.2646 | 206.1 | 1.4545 | 206.8 | 1.3894 |

Table 3 shows, inter alia, optical data of the k=2.0 ULK filled with a microelectronic grade filler, with or without the addition of ionic compound/liquid. The high refractive index after applying and heating indicates that all samples were substantially filled after heating. By comparing the refractive index after heating and after post-rinse heating, it is clear that the presence of the ionic compounds such as ionic liquids in the filler solution helps to retain the filler in the pores, as the refractive index only slightly decreases with the ionic liquids, whereas it goes back to its initial value when the microelectronic grade filler by itself is used, indicating complete filler wash out.

Example 4

An ionic salt (Cesium Acetate, CsAc) was used. While Cs ions are not thermally degradable by 400° C., they are non-mobile. CsAc was added in 2 different quantities (180 ppm and 13.6 ppt) to filler 1 solution; the 2 mixes were then used to fill both k=2.0 and k=2.4 ULK materials. The optical data measured on these systems are shown in Table 4.

TABLE 4

| ULK | Microelectronic grade fillers | Initial | | After spin-apply and heating | | After solvent rinse and post-rinse heating | |
|---|---|---|---|---|---|---|---|
| | | t (nm) | n | t (nm) | n | t (nm) | n |
| spin-on k = 2.4 | Microelectronic grade Filler 1 | 168.9 | 1.3619 | 168.9 | 1.4675 | 169.0 | 1.3631 |
| | Microelectronic grade filler 1 + 180 ppm CsAc | 487.2 | 1.3632 | 488.7 | 1.4671 | 486.3 | 1.4488 |
| | Microelectronic grade filler 1 + 13.6 ppt CsAc | 489.5 | 1.3670 | 490.8 | 1.4712 | 492.4 | 1.4693 |
| spin-on k = 2.0 | Microelectronic grade Filler 1 | 207.0 | 1.2659 | 206.5 | 1.4571 | 207.1 | 1.2688 |
| | Microelectronic grade filler 1 + 180 ppm CsAc | 205.9 | 1.2724 | 205.0 | 1.4491 | 206.1 | 1.2805 |
| | Microelectronic grade filler 1 + 13.6 ppt CsAc | 206.3 | 1.2686 | 205.6 | 1.4584 | 205.7 | 1.4078 |

Table 4 shows, inter alia, optical data of different ULKs filled with microelectronic grade fillers, with different CsAc concentrations. The high refractive indices after spin-applying and heating indicates that all samples were substantially filled after heating. However, different behaviors were observed after post-rinse heating, based on the presence and quantity of CsAc. Regarding the k=2.4 ULK, the filler wash out was completely avoided by adding just a small amount of CsAc (180 ppm). As expected, the same result was obtained when a higher CsAc concentration was used (13.6 ppt). Conversely, the small amount of CsAc (180 ppm) was not sufficient to efficiently retain the filler in the pores of the k=2.0 ULK, due the larger pores of this material. However, the beneficial effect of ions effect increased as the CsAc concentration was increased to 13.6 ppt. These results thus demonstrate that the filler wash out level can be tuned by adjusting the quantity of ionic compound introduced in the microelectronic grade filler solution.

Example 5

High CsAc concentration (13.6 ppt) was selected and added to microelectronic grade filler 2 and filler 3 solutions, and the mixes were then used to fill the k=2.0 and k=2.4 ULK materials. These results are reported in Table 5.

| ULK | Microelectronic grade fillers | Initial | | After spin-apply and heating | | After solvent rinse and post-rinse heating | |
|---|---|---|---|---|---|---|---|
| | | t (nm) | n | t (nm) | n | t (nm) | n |
| spin-on k = 2.4 | Microelectronic grade filler 2 | 488.9 | 1.3704 | 490.2 | 1.4680 | 487.7 | 1.4419 |
| | Microelectronic grade filler 2 + 13.6 ppt CsAc | 491.2 | 1.3644 | 497.0 | 1.4727 | 497.0 | 1.4727 |
| | Microelectronic grade filler 3 | 488.4 | 1.3686 | — | — | 488.5 | 1.4337 |
| | Microelectronic grade filler 3 + | 489.6 | 1.3663 | — | — | 492.8 | 1.4632 |
| spin-on k = 2.0 | Microelectronic grade filler 2 | 206.4 | 1.2711 | — | — | 206.8 | 1.2862 |
| | Microelectronic grade filler 2 + 13.6 ppt CsAc | 205.3 | 1.2718 | — | — | 205.3 | 1.3812 |
| | Microelectronic grade filler 3 | 205.8 | 1.2709 | 205.2 | 1.4353 | 206.3 | 1.2888 |
| | Microelectronic grade filler 3 + | 205.3 | 1.2689 | — | — | 205.4 | 1.4337 |

The use of microelectronic grade filler 2 and 3 solutions to fill the pores leads to partial filler wash out only for the k=2.4 ULK, while the filler is fully washed out in the case of the k=2.0 system. Regarding the k=2.4 ULK material, the presence of CsAc in the filler solution fully retained the filler in the pores. For the k=2.0 system, the filler wash out was mitigated when CsAc was combined with filler 2, and completely avoided when the ionic salt was combined with filler 3. From these observations we can conclude that CsAs is very efficient to mitigate/prevent filler wash out and that the wash out level is a function of the ULK porosity.

Altogether, these results show that the wash out of microelectronic grade fillers can be mitigated/prevented by introducing ionic compounds in the filler solution (prior to pore filling), assuring a good protection of the ULK during integration. These results also show that the wash out level is directly impacted by the ionic compound concentration in the filler solution: the higher the ion concentration, the lesser the wash out level.

Various examples of the invention have been described. These and other examples are within the scope of the following claims.

The invention claimed is:

1. A method, comprising:
    applying a filling material to a surface of a structure comprising a first layer overlying a substrate, wherein the first layer comprises a dielectric material with a plurality of pores, and wherein the filling material comprises a polymer and an ionic compound;
    heating the structure to enable the filling material to at least partially fill the plurality of pores throughout the first layer; and
    removing the residual filling material from the surface of the first layer, while leaving substantially all of the filling material in the pores of the first layer.

2. The method of claim 1, wherein the ionic compound comprises Cs.

3. The method of claim 1, wherein the ionic compound comprises Rb.

4. The method of claim 1, wherein the ionic compound comprises at least one alkali metal.

5. The method of claim 1, wherein the ionic compound comprises an organic salt.

6. The method of claim 1, wherein the ionic compound is present in the filling material in the range of 1-100,000 ppm.

7. The method of claim 1, wherein the components of the ionic compound are not electrically mobile within the dielectric material.

8. The method of claim 1, wherein at least one component of the ionic compound is thermally decomposable.

9. The method of claim 8, wherein every component of the ionic compound is stable up to 300° C.

10. The method of claim 1, wherein removing the residual filling material from the surface comprises performing a solvent rinse.

11. The method of claim 1, further comprising, after removing the residual filling material from the surface, performing at least one process on the structure.

12. The method of claim 11, further comprising removing the filling material from the plurality of pores of the first layer by heating at least one of the structure and the filling material at a temperature of about 300° C. to about 450° C. for up to about 1 hour, thereby decomposing the filling material.

13. A method, comprising:
    applying a filling material to a surface of a structure comprising a first layer overlying a substrate, wherein the first layer comprises a dielectric material having a plurality of pores, and wherein the filling material comprises a polymer and an ionic compound;
    heating the structure to a first temperature to enable the filling material to at least partially fill the plurality of pores throughout the first layer, wherein heating the structure results in a residual amount of filling material being left on the surface of the first layer;
    removing substantially all of the residual amount of filling material from the surface of the first layer, while leaving substantially all of the filling material throughout the first layer;
    performing at least one process on the structure; and
    after performing the at least one process, removing the filling material from the plurality of pores by heating the structure to a second temperature to decompose the filling material.

14. The method of claim 13, wherein the at least one process comprises a microfabrication process or an integration process.

15. The method of claim 13, wherein the at least one process is carried out at a maximum process temperature, wherein the maximum process temperature is less than the second temperature.

16. The method of claim 13, wherein removing substantially all of the residual amount of the filling material from the surface of the first layer comprises performing a solvent rinse.

17. The method of claim 13, wherein the second temperature is about 300° C. to about 400° C.

* * * * *